United States Patent
Kawashima

[11] Patent Number: 5,537,066
[45] Date of Patent: Jul. 16, 1996

[54] FLIP-FLOP TYPE AMPLIFIER CIRCUIT

[75] Inventor: Shoichiro Kawashima, Kawasaki, Japan

[73] Assignee: Fujitsu Limited, Kawasaki, Japan

[21] Appl. No.: 277,517

[22] Filed: Jul. 19, 1994

[30] Foreign Application Priority Data

Aug. 9, 1993 [JP] Japan ................................. 5-197101

[51] Int. Cl.$^6$ ...................................... H03F 3/45
[52] U.S. Cl. .............................. 327/55; 327/208; 327/57; 327/65
[58] Field of Search .................... 327/51, 52, 53, 327/54, 55, 57, 64, 65, 66, 67, 82, 198, 210, 202, 215, 219, 287, 199, 208

[56] References Cited

U.S. PATENT DOCUMENTS

| | | | |
|---|---|---|---|
| 4,169,233 | 9/1979 | Haraszti | 327/57 |
| 4,558,241 | 12/1985 | Suzuki et al. | 327/57 |
| 4,627,033 | 12/1986 | Hyslop et al. | 365/205 |
| 5,055,720 | 10/1991 | Tiede | 327/55 |
| 5,169,878 | 3/1993 | Miyamoto et al. | 327/51 |
| 5,196,737 | 3/1993 | Olmstead | 307/279 |

FOREIGN PATENT DOCUMENTS

0450454A1  10/1991  European Pat. Off. .

*Primary Examiner*—Timothy P. Callahan
*Assistant Examiner*—Jung H. Kim
*Attorney, Agent, or Firm*—Nikaido, Marmelstein, Murray & Oram

[57] ABSTRACT

A flip-flop type amplifier circuit is adapted to amplify a voltage difference between a first voltage and a second voltage. This amplifier circuit includes a first power line supplying a first power supply voltage, a second power line supplying a second power supply voltage lower than the first power supply voltage, a flip-flop circuit including first through fourth nodes, and first and second inverters coupled in a ring. The first node couples an input of the first inverter and an output of the second inverter and receiving the first voltage, and the second node couples an output of the first inverter and an input of the second inverter and receives the second voltage. A first impedance element is coupled between the first power line and the third node of the flip-flop circuit, and a second impedance element is coupled between the second power line and the fourth node of the flip-flop circuit. A switch, coupled between the third and fourth nodes of the flip-flop circuit, electrically connects the third and fourth nodes in an ON state and disconnects the third and fourth nodes in an OFF state in response to a reset control signal. The switching means is turned ON when resetting the flip-flop type amplifier circuit, and is turned OFF after the resetting, in response to the reset control signal.

11 Claims, 10 Drawing Sheets

FLIP-FLOP TYPE AMPLIFIER CIRCUIT

BACKGROUND OF THE INVENTION

The present invention generally relates to amplifier circuits, and more particularly to a flip-flop type amplifier circuit which is used in a sense amplifier or the like of a semiconductor memory device such as a static random access memory (SRAM) and a dynamic random access memory (DRAM) when amplifying an latching a minute voltage difference between two voltages.

Figure 1:
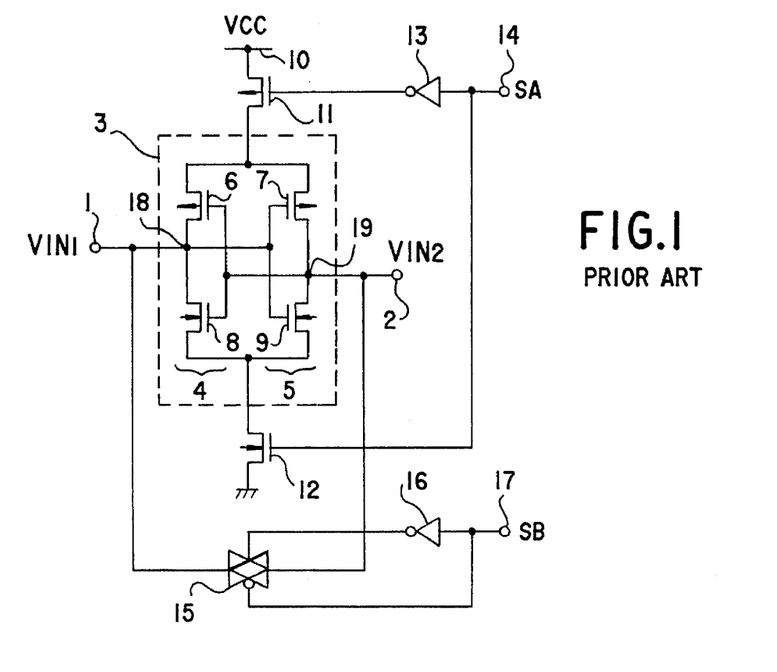
FIG. 1 is a circuit diagram showing an example of a conventional flip-flop type amplifier circuit.

Conventionally, there is a flip-flop type amplifier circuit having a construction shown in FIG. 1. In FIG. 1, a node 1 is supplied with one voltage VIN1, and a node 2 is supplied with another voltage VIN2. A voltage difference between these voltages VIN1 and VIN2 is to be amplified and latched by the flip-flop type amplifier circuit.

A flip-flop circuit 3 includes complementary metal oxide semiconductor (CMOS) inverters 4 and 5. More particularly, the flip-flop circuit 3 includes p-channel MOS transistors (hereinafter simply referred to as pMOS transistors) 6 and 7 which form load elements, and n-channel MOS transistors (hereinafter simply referred to as nMOS transistors) 8 and 9 which form driving elements. In other words, the pMOS transistor 6 and the nMOS transistor 8 form the CMOS inverter 4, and the pMOS transistor 7 and the nMOS transistor 9 form the CMOS inverter 5, and these CMOS inverters 4 and 5 are connected in a ring.

The flip-flop type amplifier circuit also includes a power line 10 for supplying a high voltage side power supply voltage Vcc of 3 V, for example, a pMOS transistor 11 for activating the flip-flop circuit 3, an nMOS transistor 12 for activating the flip-flop circuit 3, an inverter 13, and a node 14. An activation control signal SA for controlling ON (conducting) and OFF (non-conducting) states of the pMOS transistor 11 and the nMOS transistor 12 to control the activation of the flip-flop circuit 3 is supplied to this node 14.

When the activation control signal SA has the voltage Vcc (high level), the pMOS transistor 11 is ON, the nMOS transistor 12 is ON and the flip-flop circuit 3 is active.

On the other hand, when the activation control signal SA has a voltage of 0 V (low level), the pMOS transistor 11 is OFF, the nMOS transistor 12 is OFF and the flip-flop circuit 3 is inactive.

The flip-flop type amplifier circuit further includes an analog switch 15 made up of a CMOS transfer gate circuit for resetting, and an inverter 16. A reset control signal SB for controlling ON and OFF states of the analog switch 15 is supplied to a node 17.

When the reset control signal SB has a voltage of 0 V, the analog switch 15 is ON and input/output nodes 18 and 19 of the flip-flop circuit 3 are short-circuited.

On the other hand, when the reset control signal SB has the voltage Vcc, the analog switch 15 is OFF and the input/output nodes 18 and 19 of the flip-flop circuit 3 are released from the short-circuited state.

Figure 2:
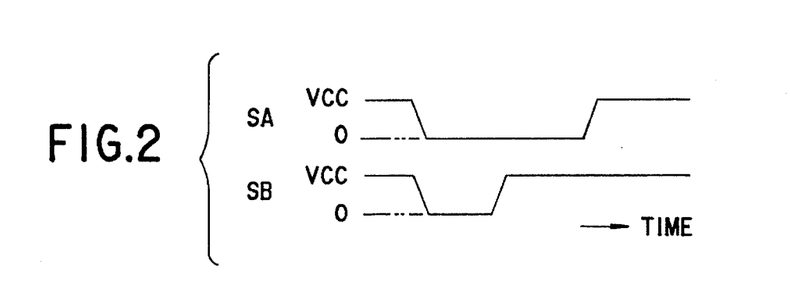
FIG. 2 is a diagram showing signal waveforms for explaining the operation of the flip-flop type amplifier circuit shown in FIG. 1.

FIG. 2 shows signal waveforms for explaining the operation of the flip-flop type amplifier circuit shown in FIG. 1. FIG. 2 shows the activation control signal SA and the reset control signal SB.

Therefore, according to the flip-flop type amplifier circuit shown in FIG. 1, the voltage difference between the voltage VIN1 that is applied to the node 18 via the node and the voltage VIN2 that is applied to the node 19 via the node 2 is amplified and latched. In this case, the activation control signal SA and the reset control signal SB are first respectively set to 0 V.

As a result, the pMOS transistor 11 is turned OFF, the nMOS transistor 12 is turned OFF, and the flip-flop circuit 3 is put into the inactive state. In addition, the analog switch 15 is turned ON, the nodes 18 and 19 are short-circuited, and the potentials of the nodes 18 and 19 become the same, thereby carrying out a resetting operation.

Next, the reset control signal SB is set to the voltage Vcc. Hence, the analog switch 15 is turned OFF, and the short-circuited state between the nodes 18 and 19 is released. As a result, the operation of supplying the voltage VIN1 to the node 18 and supplying the voltage VIN2 to the node 19 is carried out.

Then, the activation control signal SA is set to the voltage Vcc. Thus, the pMOS transistor 11 is turned ON, the nMOS transistor 12 is turned ON, and the flip-flop circuit 3 is put into the active state.

If VIN1>VIN2, for example, the pMOS transistor 6 finally turns ON, the pMOS transistor 7 turns OFF, the nMOS transistor 8 turns OFF and the nMOS transistor 9 turns ON.

Consequently, the potential of the node 18 becomes the voltage Vcc, and the potential of the node 19 becomes 0 V. Accordingly, the potential difference between the voltages VIN1 and VIN2 is amplified, and these voltages are latched during the time when the activation control signal SA has the voltage Vcc.

On the other hand, if VIN1<VIN2, the pMOS transistor 6 finally turns OFF, the pMOS transistor 7 turns ON, the nMOS transistor 8 turns ON and the nMOS transistor 9 turns OFF.

As a result, the potential of the node 18 becomes 0 V, and the potential of the node 19 becomes the voltage Vcc. The potential difference between the voltages VIN1 and VIN2 is amplified, and these voltages are latched during the time when the activation control signal SA has the voltage Vcc.

However, when changing the activation control signal SA from 0 V to the voltage Vcc and starting the latch operation of the flip-flop circuit 3 in the flip-flop type amplifier circuit shown in FIG. 1, there is a time in which the pMOS transistor 11 and the nMOS transistor 12 operate as constant current source circuits. For this reason, an erroneous operation will occur if the voltage difference between the voltages VIN1 and VIN2 is too small.

Such an erroneous operation must be avoided when using the flip-flop type amplifier circuit in a sense amplifier of the SRAM, for example. Hence, it is necessary to delay the timing with which the activation control signal SA is changed from 0 V to the voltage Vcc, that is, the start timing of the latch operation of the flip-flop circuit 3, until the voltage difference between the voltages VIN1 and VIN2 increases to a sufficiently large magnitude that will not cause the erroneous operation. But because of this delay, there was a problem in that a high-speed circuit operation cannot be achieved when this flip-flop type amplifier circuit is used.

Figure 3:
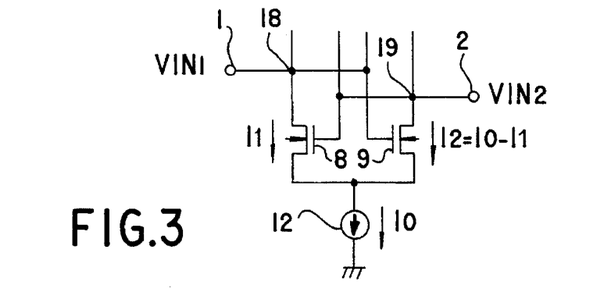
FIG. 3 is a circuit diagram for explaining the problems of the flip-flop type amplifier circuit shown in FIG. 1.

The above described problem will be described in more detail by referring to FIGS. 3 and 4 with respect to the nMOS transistor 12, for example.

When changing the activation control signal SA from 0 V to the voltage Vcc, a gate-source voltage $V_{GS}$ of the nMOS transistor 12 becomes smaller than a drain-source voltage $V_{DS}$ of the nMOS transistor 12 (that is, $V_{GS} < V_{DS}$) for a predetermined time after the change starts. Hence, during this predetermined time, the nMOS transistor 12 operates as a constant current source circuit for supplying a constant current $I_0$ as shown in FIG. 3.

If a current flowing through the nMOS transistor 8 is denoted by $I_1$, a current $I_2$ flowing through the nMOS transistor 9 becomes $I_0-I_1$. Hence, when VIN1>VIN2, fop example, a current that flows through the nMOS transistor 8 is larger by an amount corresponding to an amount the voltage VIN1 is higher than the voltage VIN2. Accordingly, a current that is smaller flows through the nMOS transistor 9 due to the current mirror effect.

Figure 4:
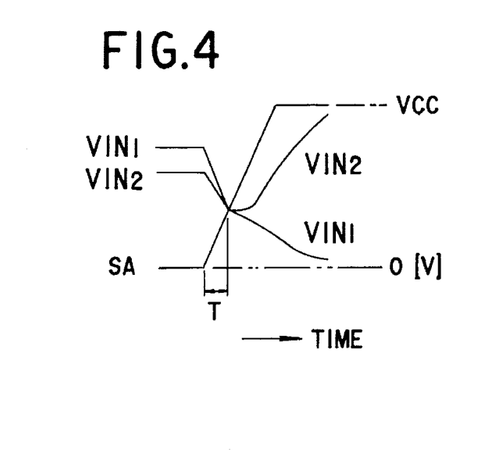
FIG. 4 is a diagram showing signal waveforms for explaining the problems of the flip-flop type amplifier circuit shown in FIG. 1.

As a result, during a time T in which the nMOS transistor 12 operates as the constant current source circuit, the voltage VIN1 falls at a speed higher than that of the voltage VIN2 as shown in FIG. 4. For this reason, if the voltage difference between the voltages VIN1 and VIN2 is too small, the relationship VIN1>VIN2 changes to the relationship VIN1= VIN2 to thereby cause the erroneous operation.

Therefore, when using the above flip-flop type amplifier circuit in the sense amplifier of the SRAM, for example, it is necessary to delay the timing with which the activation control signal SA is changed from 0 V to the voltage Vcc, that is, the start timing of the latch operation of the flip-flop circuit 3, until the voltage difference between the voltages VIN1 and VIN2 increases to a sufficiently large voltage which will not cause the erroneous operation. As described above, this delay prevented the high-speed circuit operation.

Figure 5:
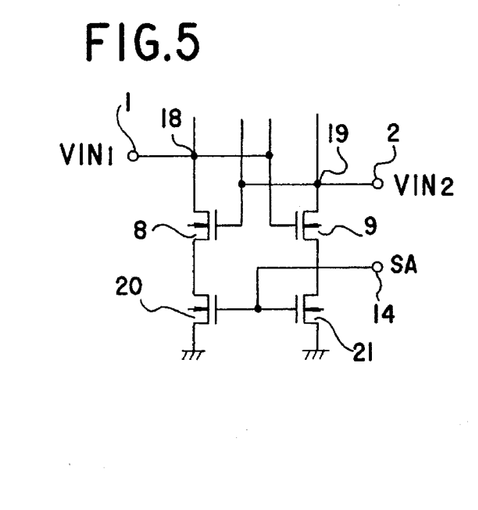
FIG. 5 is a circuit diagram showing a part of a conceivable flip-flop type amplifier circuit.

In order to eliminate this problem, it is conceivable to connect nMOS transistors 20 and 21 for activating the flip-flop circuit 3 respectively between the source of the nMOS transistor 8 and the ground and between the source of the nMOS transistor 9 and the ground, as shown in FIG. 5. In this case, the nMOS transistors 20 and 21 forms independent current paths, so that the current mirror effect is eliminated. But there still exists a time in which the nMOS transistors 20 and 21 operate as constant current source circuits.

Accordingly, this conceivable arrangement does not require the start timing of the latch operation of the flip-flop circuit 3 to be delayed as much as the flip-flop type amplifier circuit shown in FIG. 1. However, it is still necessary to delay the start timing of the latch operation of the flip-flop circuit 3 by taking into account the time in which the nMOS transistors 20 and 21 operate as the constant current source circuits. Hence, there is a problem in that the circuit operation speed is slowed down by this required timing delay.

SUMMARY OF THE INVENTION

Accordingly, it is a general object of the present invention to provide a novel and useful flip-flop type amplifier circuit in which the problems described above are eliminated.

Another and more specific object of the present invention is to provide a flip-flop type amplifier circuit adapted to amplify a voltage difference between a first voltage and a second voltage, comprising a first power line supplying a first power supply voltage, a second power line supplying a second power supply voltage lower than the first power supply voltage, a flip-flop circuit including first through fourth nodes, and first and second inverters coupled in a ring, where the first node couples an input of the first inverter and an output of the second inverter and receiving the first voltage, and the second node couples an output of the first inverted and an input of the second inverter and receiving the second voltage, a first impedance element coupled between the first power line and the third node of the flip-flop circuit, a second impedance element coupled between the second power line and the fourth node of the flip-flop circuit, and switching means, coupled between the third and fourth nodes of the flip-flop circuit, for electrically connecting the third and fourth nodes in an ON state and for disconnecting the third and fourth nodes in an OFF state in response to a reset control signal, where the switching means is turned ON when resetting the flip-flop type amplifier circuit and is turned OFF after the resetting, in response to the reset control signal. According to the flip-flop type amplifier circuit of the present invention, it is possible to carry out the resetting operation without the need to connect an element which would operate as a constant current source circuit for a predetermined time between the first power line and the third node of the flip-flop circuit and between the fourth node of the flip-flop circuit and the second power line. As a result, when the present invention is applied to a sense amplifier of a semiconductor memory device, for example, and the latch operation of the flip-flop circuit is to be started after the resetting operation is completed, it is unnecessary to delay the start timing of the latch operation of the flip-flop circuit by taking into consideration the time it takes for the voltage difference between the first and second voltages to become sufficiently large. In other words, the latch operation of the flip-flop circuit can be started immediately after the resetting operation is completed. Therefore, it is possible to realize a high-speed circuit operation.

Other objects and further features of the present invention will be apparent from the following detailed description when read in conjunction with the accompanying drawings.

DESCRIPTION OF THE PREFERRED EMBODIMENTS

First, a description will be given of the operating principle of the flip-flop type amplifier circuit according to the present invention, by referring to FIG. 6.

Figure 6:
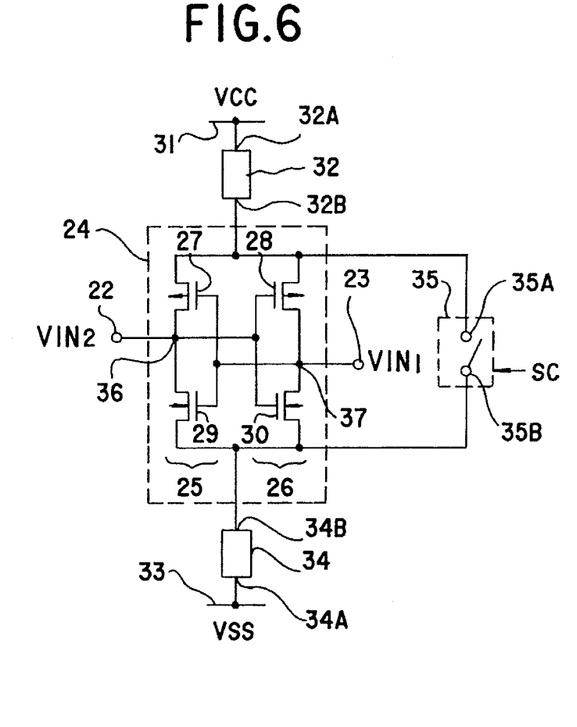
FIG. 6 is a circuit diagram for explaining the operating principle of a flip-flop type amplifier circuit according to the present invention.

In FIG. 6, a voltage VIN1 is input to a node 23, and another voltage VIN2 is input to a node 22. The flip-flop type amplifier circuit amplifies the voltage difference between the voltages VIN1 and VIN2.

A flip-flop circuit 24 includes inverters 25 and 26. The inverter 25 is made up of a p-channel insulated gate type field effect transistor (FET) 27 which forms a load element, and an n-channel insulated gate type FET 29 which forms a driving element. The inverter 26 is made up of a p-channel insulated gate type FET 28 which forms a load element, and an n-channel insulated gate type FET 30 which forms a driving element.

A power line 31 supplies a high voltage side power supply voltage Vcc of 3 V, for example. An impedance element 32 is coupled between the power line 31 and the flip-flop circuit 24. A power line 33 supplies a low voltage side power supply voltage Vss of 0 V, for example. An impedance element 34 is coupled between the power line 33 and the flip-flop circuit 24.

An analog switch 35 forms a reset circuit for resetting the potentials of nodes 36 and 37 to the same potential. A reset control signal SC controls the ON/OFF state of the analog switch 35. The analog switch 35 is turned ON when resetting and is turned OFF after the resetting.

In other words, in the flip-flop type amplifier circuit of the present invention, one end 32A of the impedance element 32 is connected to the power line 31, and one end 34A of the impedance element 34 is connected to the power line 33. The source of the p-channel insulated gate type FET 27 is connected to another end 32B of the impedance element 32, and the source of the n-channel insulated gate type FET 29 is connected to another end 34B of the impedance element 34. In addition, the source of the p-channel insulated gate type FET 28 is connected to the other end 32B of the impedance element 32, and the source of the n-channel insulated gate type FET 30 is connected to the other end 34B of the impedance element 34. Hence, in the flip-flop circuit 24, the inverters 25 and 26 are connected in a ring. Furthermore, the analog switch 35 has a connecting end 35A which connects to the sources of the p-channel insulated gate type FETs 27 and 28, and another end 35B connected to the sources of the n-channel insulated gate type FETs 29 and 30. As described above, the analog switch 35 is turned ON when resetting, and is turned OFF after the resetting. Using this construction, the voltage difference between the voltage VIN1 supplied to the node 37 and the voltage VIN2 supplied to the node 36, where the node 37 connects the output end of the inverter 26 and the input end of the inverter 25, and the node 36 connects the output end of the inverter 25 and the input end of the inverter 26.

In the present invention, when the analog switch 35 is turned ON, the sources of the p-channel insulated gate type FETs 27 and 28 and the source of the n-channel insulated gate type FETs 29 and 30 are short-circuited, and the potential of the sources of the p-channel insulated gate type FETs 27 and 28 and the potential of the sources of the n-channel insulated gate type FETs 29 and 30 become the same. As a result, the potentials of the nodes 36 and 37 in the flip-flop circuit 24 become the same.

In other words, in the present invention, the impedance element 32 is connected between the power line 31 and the sources of the p-channel insulated gate type FETs 27 and 28, and the impedance element 34 is connected between the power line 33 and the sources of the n-channel gate insulated type FETs 29 and 30. In addition, the analog switch 35 is provided so that a resetting may be made by short-circuiting the sources of the p-channel insulated gate type FETs 27 and 28 and the sources of the n-channel insulated gate type FETs 29 and 30.

Therefore, the present invention can carry out the resetting operation without the need to connect an element which would operate as a constant current source circuit for a predetermined time between the power line 31 and the sources of the p-channel insulated gate type FETs 27 and 28 and between the power line 33 and the sources of the n-channel insulated gate type FETs 29 and 30.

For this reason, even if the present invention is used in a sense amplifier of a semiconductor memory device, for example, it is possible to start the latch operation of the flip-flop circuit 24 immediately after the resetting operation is completed. In other words, when starting the latch operation of the flip-flop circuit 24 after the resetting operation is completed, it is unnecessary to delay the start timing of the latch operation of the flip-flop circuit 24 by taking into account the time it takes for the voltage difference between the voltages VIN1 and VIN2 to become sufficiently large. Therefore, according to the present invention, it is possible to realize a high-speed circuit operation.

The voltage VIN1 may be supplied to the node 37 via a first analog switch for voltage transfer, and the voltage VIN2 may be supplied to the node 36 via a second analog switch for voltage transfer. In this case, the first analog switch has one end supplied with the voltage VIN1 and another end connected to the node 37, and is turned ON before the start of the resetting operation and is turned OFF after the resetting operation is completed. On the other hand, the second analog switch has one end supplied with the voltage VIN2 and another end connected to the node 36, and is turned ON before the start of the resetting operation and is turned OFF after the resetting operation is completed.

In addition, it is possible to provide a first current mirror circuit having a mirror current output end connected to the node 37 and a second current mirror circuit having a mirror current output end connected to the node 36. In this case, the voltage difference is obtained by amplifying the voltage difference between the voltage at the mirror current output end of the first current mirror circuit and the voltage at the mirror current output end of the second current mirror circuit.

Figure 7:
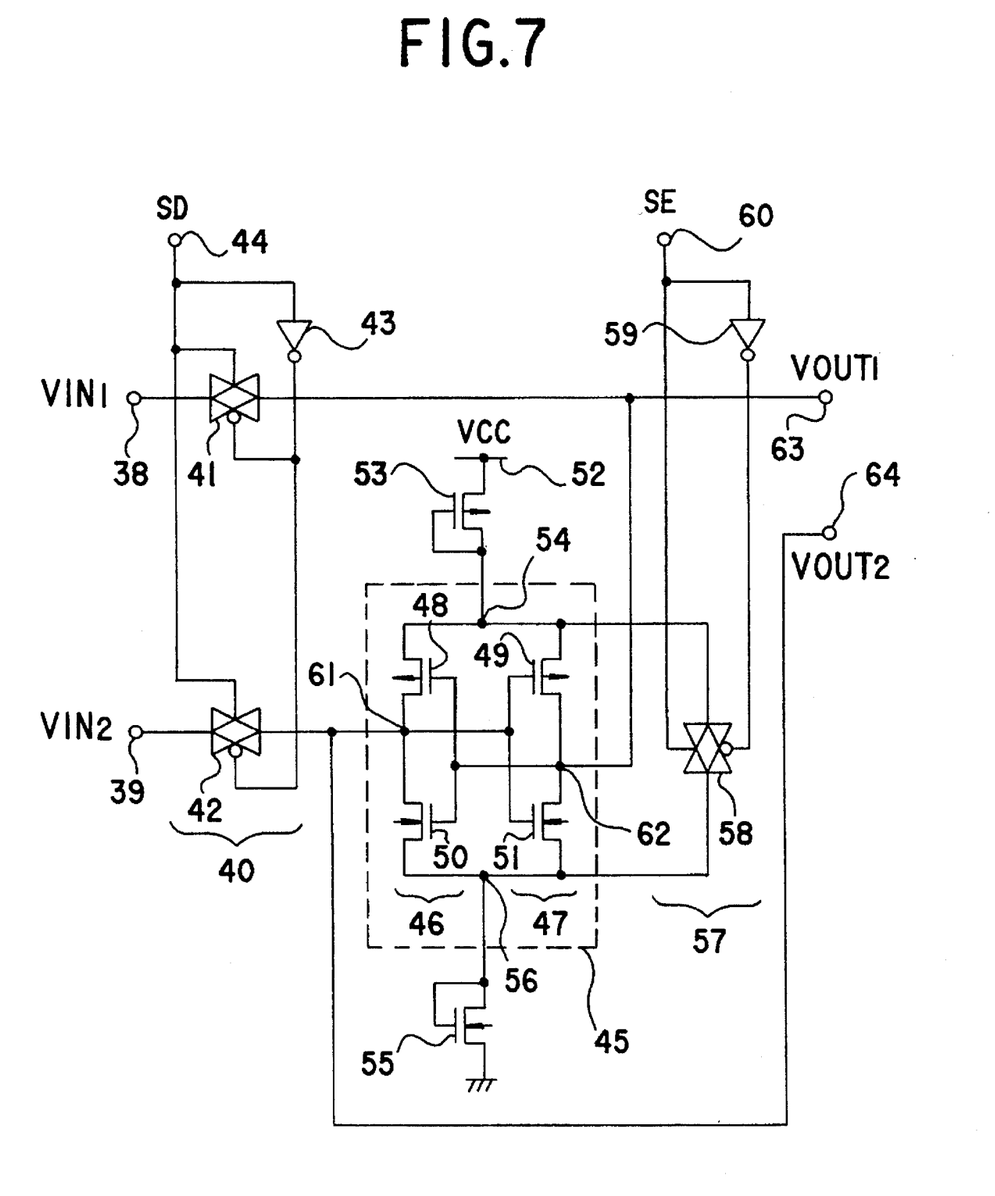
FIG. 7 is a circuit diagram showing a first embodiment of the flip-flop type amplifier circuit according to the present invention.
Figure 8:
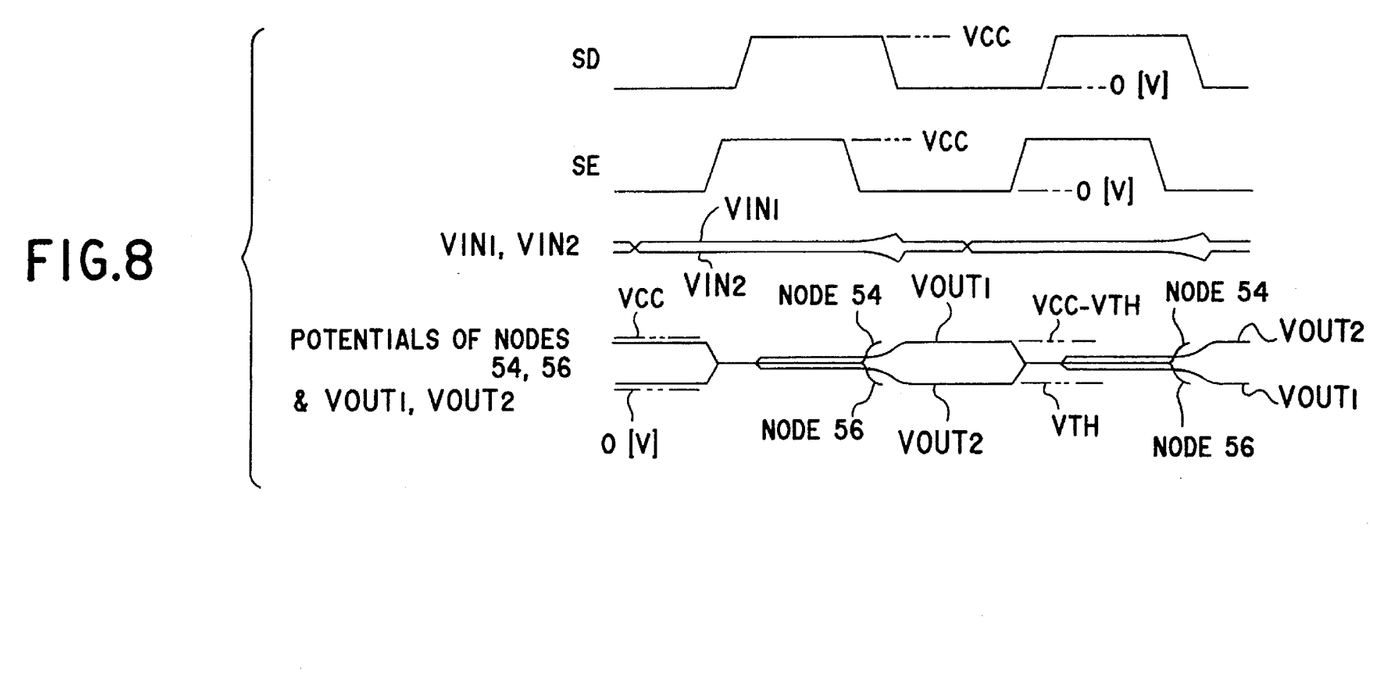
FIG. 8 is a diagram showing signal waveforms for explaining the operation of the first embodiment.

Next, a description will be given of a first embodiment of the flip-flop type amplifier circuit according to the present invention, by referring to FIGS. 7 and 8. FIG. 7 shows the first embodiment, and FIG. 8 shows signal waveforms for explaining the operation of the first embodiment.

In FIG. 7, a voltage VIN1 is supplied to a node 38, and a voltage VIN2 is supplied to a node 39. The flip-flop type amplifier circuit amplifies the voltage difference between the voltages VIN1 and VIN2.

A transfer gate circuit 40 includes analog switches 41 and 42, an inverter 43, and a node 44. The analog switches 41 and 42 are respectively made up of CMOS transfer gates. A transfer control signal SD for controlling ON/OFF stages of the analog switches 41 and 42 is input to the node 44.

When the transfer control signal SD has a high level, the analog switches 41 and 42 are turned ON. On the other hand, when the transfer control signal SD has a low level, the analog switches 41 and 42 are turned OFF.

A flip-flop circuit 45 includes CMOS inverters 46 and 47. The CMOS inverter 46 includes a pMOS transistor 48 forming a load element and an nMOS transistor 50 forming a driving element. The CMOS inverter 47 includes a pMOS transistor 49 forming a load element and an nMOS transistor 51 forming a driving element. In other words, the flip-flop circuit 45 includes the CMOS inverters 45 and 46 which are connected in a ring.

A power line 52 supplies a high voltage side power supply voltage Vcc of 3 V, for example. A pMOS transistor 53 forms an impedance element. This pMOS transistor 53 has a source connected to the power line 52, and a gate and a drain which are connected. The drain of the pMOS transistor 53 is connected to a node 54 which connects the source of the pMOS transistor 48 and the source of the pMOS transistor 49. Hence, the pMOS transistor 53 operates in the triode region.

An nMOS transistor 55 forms an impedance element. This nMOS transistor 55 has a gate and a drain which are connected, and a source which is grounded. The drain of the nMOS transistor 55 is connected to a node 56 which connects the source of the nMOS transistor 50 and the source of the nMOS transistor 51. Hence, the nMOS transistor 55 operates in the triode region.

A reset circuit 57 includes an analog switch 58 that is made up of a CMOS transfer gate, an inverter 59, and a node 60. A reset control signal SE which controls the ON/OFF state of the analog switch 58 is input to the node 60.

When the reset control signal SE has the voltage Vcc, the analog switch 58 is turned ON, the nodes 54 and 56 are short-circuited, and the nodes 61 and 62 are reset to the same potential.

On the other hand, when the reset control signal SE is 0 V, the analog switch 58 is turned OFF, and the nodes 54 and 56 are released from the short-circuited state.

In this first embodiment, an absolute value $|VTH_p|$ of a threshold voltage $VTH_p$ of the pMOS transistor 53 is set equal to a threshold voltage $VTH_n$ of the nMOS transistor 55, so that $|VTH_p|=VTH_n=VTH$. Hence, in the ON state of the analog switch 58, the potentials of the nodes 54 and 56 become (½)·Vcc, and the potentials of the nodes 61 and 62 are clamped to (½)·Vcc±VTH.

An output voltage VOUT1 corresponding to the voltage VIN1 supplied to the node 38 is output from a node 63. On the other hand, an output voltage VOUT2 corresponding to the voltage VIN2 supplied to the node 39 is output from a node 64.

FIG. 8 shows the signal waveforms are various parts of the flip-flop type amplifier circuit shown in FIG. 7. FIG. 8 shows the timings of the transfer control signal SD, the reset control signal SE, the voltages VIN1 and VIN2, and the potentials of the nodes 54 and 56 together with the output voltages VOUT1 and VOUT2.

That is, in this first embodiment, the analog switches 41 and 42 are OFF when the transfer control signal SD is 0 V, and the analog switch 58 is OFF when the reset control signal SE is 0 V. Hence, the voltage VIN1 is supplied to the node 38 and the voltage VIN2 is supplied to the node 39 in a state where the flip-flop circuit 45 latches the previous data, where VIN1>VIN2.

The reset control signal SE is set to the voltage Vcc before the transfer control signal SD is set to the voltage Vcc, and the analog switch 58 is accordingly turned ON. Hence, the nodes 54 and 56 are short-circuited via the analog switch 58, and the potentials of the nodes 54 and 56 become the same.

As a result, the potentials of the nodes 61 and 62, that is, the output voltages VOUT1 and VOUT2 become the same, and the resetting operation is completed.

Next, the transfer control signal SD is set to the voltage Vcc, and the analog switches 41 and 42 are turned ON. Accordingly, the output voltage VOUT1 becomes equal to the voltage VIN1, and the output voltage VOUT2 becomes equal to the voltage VIN2.

Then, the reset control signal SE is set to 0 V, and the analog switch 58 is turned OFF. In addition, the short-circuited state between the nodes 54 and 56 is released. As a result, the potential of the node 54 rises to a voltage Vcc–VTH, and the potential of the node 56 falls to the voltage VTH.

Because VIN1>VIN2, the pMOS transistor 48 is OFF, the nMOS transistor 50 is ON, the pMOS transistor 49 is ON, and the nMOS transistor 51 is OFF.

Therefore, the potential of the node 62 rises towards the voltage Vcc–VTH, and the potential of the node 61 falls towards the voltage VTH. That is, the voltage VIN1 and the output voltage VOUT1 rise towards the voltage Vcc–VTH, and the voltage VIN2 and the output voltage VOUT2 fall towards the voltage VTH.

Next, the transfer control signal SD is set to 0 V, and the analog switches 41 and 42 are turned OFF. As a result, the voltage VIN1 falls to the original voltage and the voltage VIN2 rises to the original voltage. In addition, the potential of the node 62 becomes the voltage Vcc–VTH, that is, the output voltage VOUT1 becomes the voltage Vcc–VTH. Further, the potential of the node 61 becomes the voltage VTH, that is, the output voltage VOUT2 becomes the voltage VTH, and the amplifying operation is completed.

These output voltages VOUT1 and VOUT2 are latched during the time in which the reset control signal SE is 0 V.

According to this first embodiment, the pMOS transistor 53 which forms the impedance element is connected between the power line 52 and the node 54 of the flip-flop circuit 45, and the nMOS transistor 55 which forms the impedance element is connected between the node 56 of the flip-flop circuit 45 and the ground. In addition, the nodes 54 and 56 are short-circuited via the analog switch 58 so that the resetting operation may be made to make the potentials of the nodes 61 and 62 the same.

In other words, it is possible to carry out the resetting operation without the need to connect an element which would operate as a constant current source circuit for a predetermined time between the power line 52 and the node 54 of the flip-flop circuit 45 and between the node 56 of the flip-flop circuit 45 and the ground.

As a result, when this first embodiment is used in the sense amplifier of the semiconductor memory device, for example, and the latch operation of the flip-flop circuit 45 is to be started after the resetting operation is completed, it is unnecessary to delay the start timing of the latch operation of the flip-flop circuit 45 by taking into consideration the time it takes for the voltage difference between the voltages VIN1 and VIN2 to become sufficiently large. In other words, the latch operation of the flip-flop circuit 45 can be started immediately after the resetting operation is completed. Therefore, it is possible to realize a high-speed circuit operation.

Figure 9:
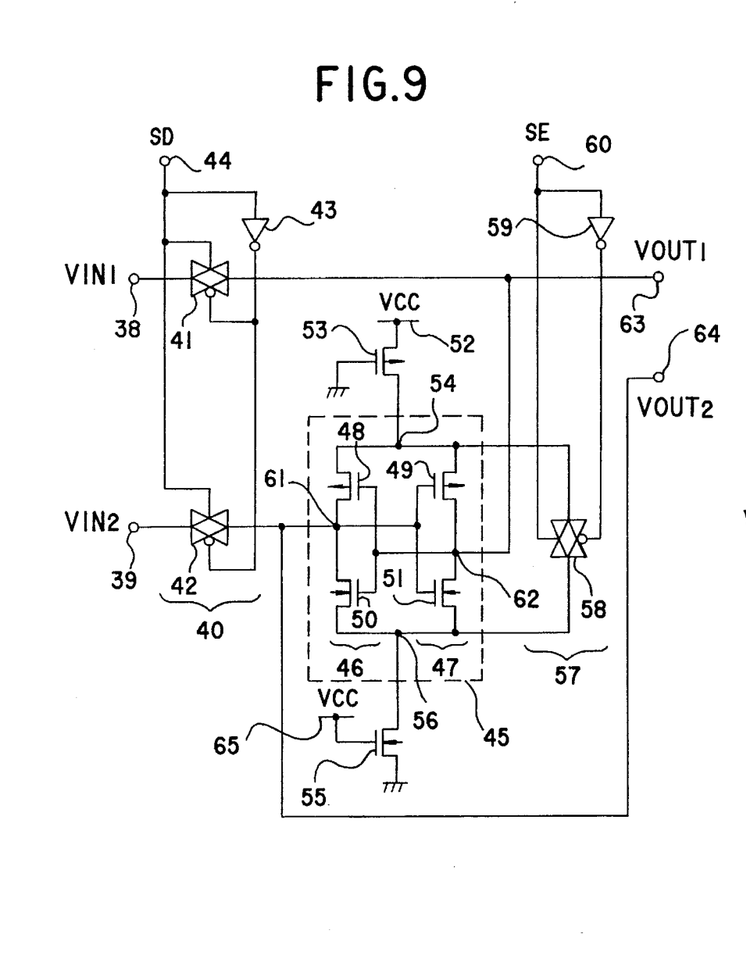
FIG. 9 is a circuit diagram showing a second embodiment of the flip-flop type amplifier circuit according to the present invention.

Next, a description will be given of a second embodiment of the flip-flop type amplifier circuit according to the present invention, by referring to FIG. 9. FIG. 9 shows the second embodiment. In FIG. 9, those parts which are the same as those corresponding parts in FIG. 7 are designated by the same reference numerals, and a description thereof will be omitted.

In this second embodiment, the pMOS transistor 53 is connected between the power line 52 and the node 54 of the flip-flop circuit 45 as an impedance element, and the nMOS transistor 55 is connected between the node 56 of the flip-flop circuit 45 and the ground as an impedance element. In addition, the nodes 54 and 56 are short-circuited via the analog switch 58, so that it is possible to carry out the resetting operation by making the potentials of the nodes 61 and 62 the same.

In other words, it is possible to carry out the resetting operation without the need to connect an element which would operate as a constant current source circuit for a predetermined time between the power line 52 and the node 54 of the flip-flop circuit 45 and between the node 56 of the flip-flop circuit 45 and the ground.

As a result, when this second embodiment is used in the sense amplifier of the semiconductor memory device, for example, and the latch operation of the flip-flop circuit 45 is to be started after the resetting operation is completed, it is unnecessary to delay the start timing of the latch operation of the flip-flop circuit 45 by taking into consideration the time it takes for the voltage difference between the voltages VIN1 and VIN2 to become sufficiently large. In other words, the latch operation of the flip-flop circuit 45 can be started immediately after the resetting operation is completed. Therefore, it is possible to realize a high-speed circuit operation.

Unlike the first embodiment, the gate of the pMOS transistor 53 in this second embodiment is grounded, and the gate of the nMOS transistor 55 is connected to a power line 65 for supplying the power supply voltage Vcc. Hence, it is possible to make the high level of the output voltages VOUT1 and VOUT2 equal to the voltage Vcc, and to make the low level of the output voltages VOUT1 and VOUT2 equal to 0 V. For this reason, this second embodiment is more effective compared to the first embodiment when reducing the power supply voltage Vcc.

Figure 10:
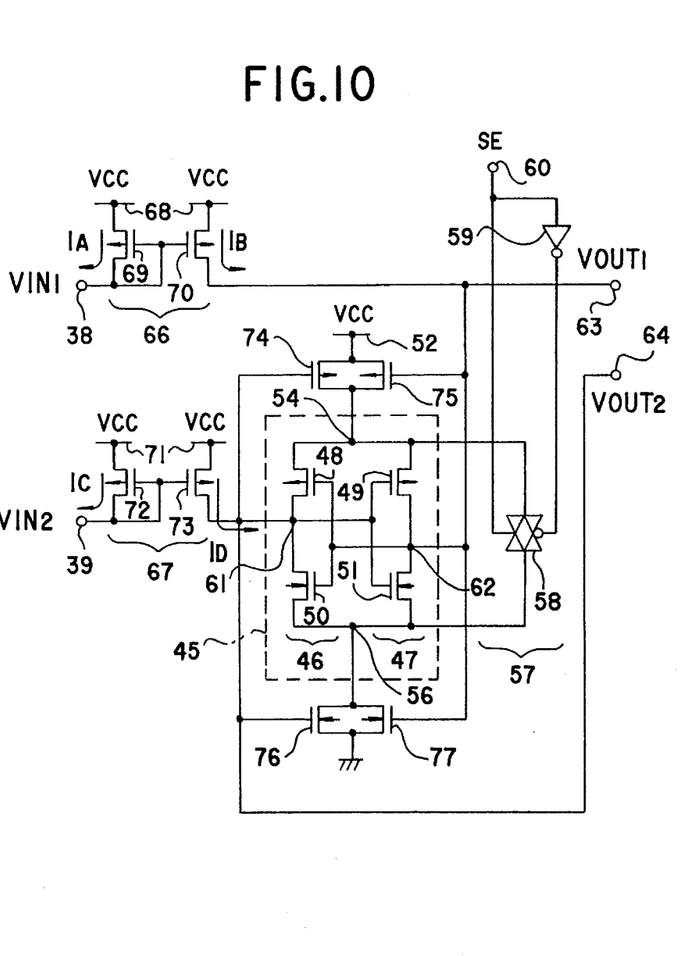
FIG. 10 is a circuit diagram showing a third embodiment of the flip-flop type amplifier circuit according to the present invention.
Figure 11:
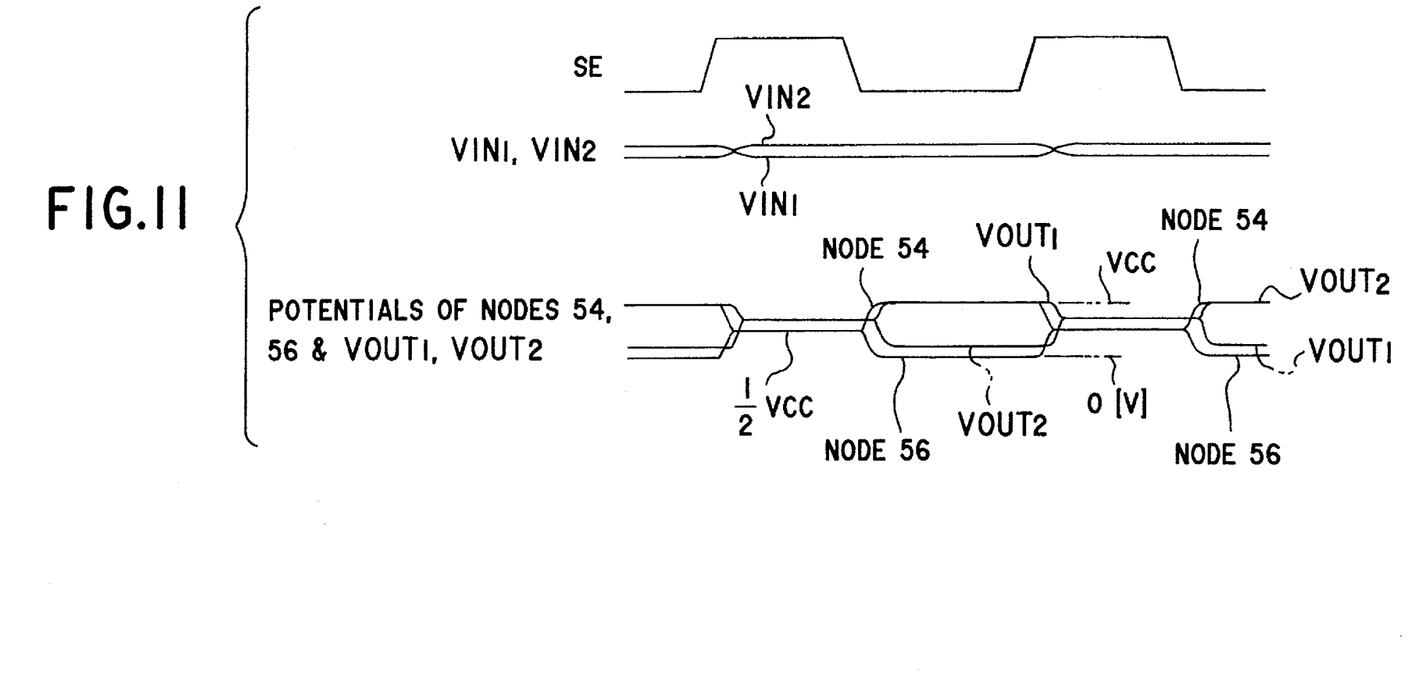
FIG. 11 is a diagram showing signal waveforms for explaining the operation of the third embodiment.

Next, a description will be given of a third embodiment of the flip-flop type amplifier circuit according to the present invention, by referring to FIGS. 10 and 11. FIG. 10 shows the third embodiment, and FIG. 11 shows signal waveforms for explaining the operation of the third embodiment. In FIG. 10, those parts which are the same as those corresponding parts in FIG. 7 are designated by the same reference numerals, and a description thereof will be omitted.

This third embodiment differs from the first and second embodiments described above basically on two points.

First, in this third embodiment, current mirror circuits 66 and 67 are provided in place of the transfer gate circuit 40.

The current mirror circuit 66 is coupled to a power line 68 for supplying the power supply voltage Vcc, and includes pMOS transistors 69 and 70. A mirror current $I_A$ flows through the pMOS transistor 69, and a mirror current $I_B$ flows through the pMOS transistor 70. The drain of the pMOS transistor 69 is connected to the node 38, and the drain of the pMOS transistor 70 is connected to the nodes 62 and 63.

The current mirror circuit 67 is coupled to a power line 71 for supplying the power supply voltage Vcc, and includes pMOS transistors 72 and 73. A mirror current $I_C$ flows through the pMOS transistor 72, and a mirror current $I_D$ flows through the pMOS transistor 73. The drain of the pMOS transistor 72 is connected to the node 39, and the drain of the pMOS transistor 72 is connected to the nodes 61 and 64.

Second, in this third embodiment, pMOS transistors 74 and 75 are provided between the power line 52 and the node 54 as impedance elements. In addition, nMOS transistors 76 and 77 are provided between the node 56 and the ground as impedance elements.

Otherwise, this third embodiment is basically the same as the first embodiment described above.

The pMOS transistor 74 has a source connected to the power line 52, a gate connected to the node 61, and a drain connected to the node 54. The pMOS transistor 75 has a source connected to the power line 52, a gate connected to the node 62, and a drain connected to the node 54. Hence, one of the pMOS transistors 74 and 75 operates in the triode region.

On the other hand, the nMOS transistor 76 has a drain connected to the node 56, a gate connected to the node 61, and a source that is grounded. The nMOS transistor 77 has a drain connected to the node 56, a gate connected to the node 62, and a source that is grounded. Thus, one of the nMOS transistors 76 and 77 operates in the triode region.

FIG. 11 shows the signal waveforms at various parts of the flip-flop type amplifier circuit shown in FIG. 10. FIG. 11 shows the timings of the reset control signal SE, the voltages VIN1 and VIN2, and the potentials at the nodes 54 and 56 together with the output voltages VOUT1 and VOUT2.

According to this third embodiment, when the reset control signal SE changes from 0 V to the voltage Vcc and after the analog switch 58 turns ON, the voltage VIN1 is immediately supplied to the node 38 and the voltage VIN2 is immediately supplied to the node 39. In this particular case, it is assumed that VIN1<VIN2.

As a result, the nodes 54 and 56 are short-circuited via the analog switch 58, and the potentials of the nodes 54 and 56 become the same, so that the potentials of the nodes 61 and 62 are reset to the same potential.

When the nodes 54 and 56 are short-circuited via the analog switch 58, the potentials of the nodes 54 and 56 in this third embodiment become (½)·Vcc.

Since VIN1<VIN2 in this case, $I_B>I_D$. Consequently, the potentials of the nodes 61 and 62, that is, the output voltages VOUT1 and VOUT2, are clamped to a voltage which is slightly higher than (½)·Vcc due to the effects of the current $I_B$.

Next, the reset control signal SE is set to 0 V, and the analog switch 58 is turned OFF. In addition, the short-circuited state between the nodes 54 and 56 is released, and the amplifying operation of the flip-flop circuit 45 is started.

Because the potential of the node 62 is higher than the potential of the node 61, the pMOS transistor 48 turns OFF, the nMOS transistor 50 turns ON, the pMOS transistor 49 turns ON and the nMOS transistor 51 turns OFF finally.

On the other hand, the pMOS transistor 74 turns ON, the pMOS transistor 75 turns OFF, the nMOS transistor 76 turns OFF and the nMOS transistor 77 turns ON finally.

In other words, in this particular case, the pMOS transistor 75 out of the pMOS transistors 74 and 75 operates in the triode region, and the nMOS. transistor 76 out of the nMOS transistors 76 and 77 operates in the triode region.

As a result, the potential of the node 54 becomes the voltage Vcc and the potential of the node 56 becomes 0 V. Accordingly, the potential of the node 62, that is, the output voltage VOUT1, becomes the voltage Vcc. The potential of the node 61, that is, the output voltage VOUT2, becomes a voltage slightly higher than 0 V due to the effects of the current $I_D$ that flows from the current mirror circuit 67. Therefore, the amplifying operation is completed.

The output voltages VOUT1 and VOUT2 are latched during the time in which the reset control signal SE is 0 V.

Therefore, according to this third embodiment, the pMOS transistors 74 and 75 are connected between the power line 52 and the node 54 of the flip-flop circuit 45 as the impedance elements, and the nMOS transistors 76 and 77 are connected between the node 56 of the flip-flop circuit 45 and the ground as the impedance elements. In addition, the nodes 54 and 56 are short-circuited via the analog switch 58, so that the resetting operation can be carried out by making the potentials of the nodes 61 and 62 to the same potential.

In other words, it is possible to carry out the resetting operation without the need to connect an element which would operate as a constant current source circuit for a predetermined time between the power line 52 and the node 54 of the flip-flop circuit 45 and between the node 56 of the flip-flop circuit 45 and the ground.

As a result, when this third embodiment is used in the sense amplifier of the semiconductor memory device, for example, and the latch operation of the flip-flop circuit 45 is to be started after the resetting operation is completed, it is unnecessary to delay the start timing of the latch operation of the flip-flop circuit 45 by taking into consideration the time it takes for the voltage difference between the voltages VIN1 and VIN2 to become sufficiently large. In other words, the latch operation of the flip-flop circuit 45 can be started immediately after the resetting operation is completed. Therefore, it is possible to realize a high-speed circuit operation.

Furthermore, in this third embodiment, the voltage which is slightly higher than the voltage (½)·Vcc is applied to the gates of the pMOS transistors 74 and 75 and to the gates of the nMOS transistors 76 and 77 when carrying out the resetting operation. For this reason, the current which flows from the power line 52 to the ground via the pMOS transistors 74 and 75, the analog switch 58 and the nMOS transistors 76 and 77 in this third embodiment becomes smaller than the current which flows from the power line 52 to the ground via the pMOS transistor 53, the analog switch 58 and the nMOS transistor 55 in the first and second embodiments.

Accordingly, the third embodiment can reduce the power consumption when compared to the first and second embodiments.

In addition, since this third embodiment provides the current mirror circuits 66 and 67 in place of the transfer gate circuit 40, it is possible to eliminate the time in which the transfer of the voltages VIN1 and VIN2 is controlled. Consequently, the circuit operation speed can be increased compared to the first and second embodiments.

Figure 12:
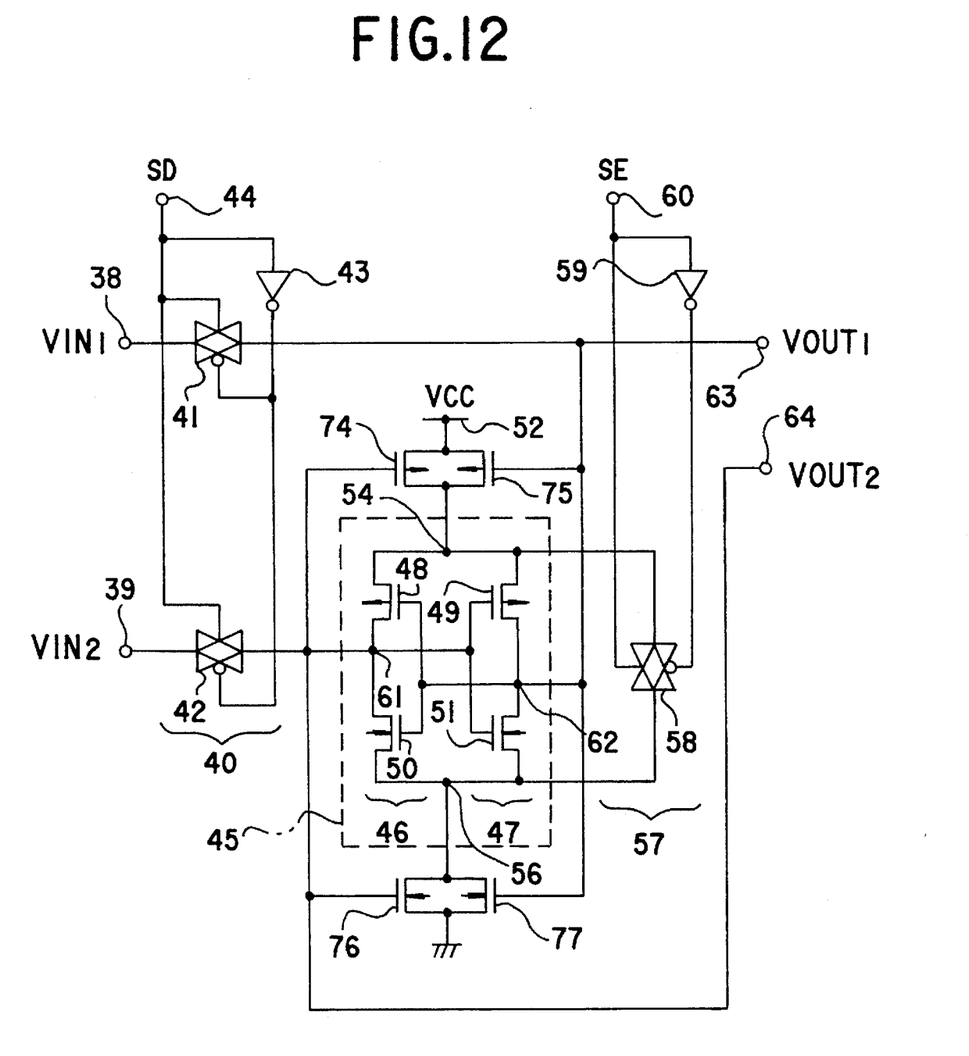
FIG. 12 is a circuit diagram showing a fourth embodiment of the flip-flop type amplifier circuit according to the present invention.
Figure 13:
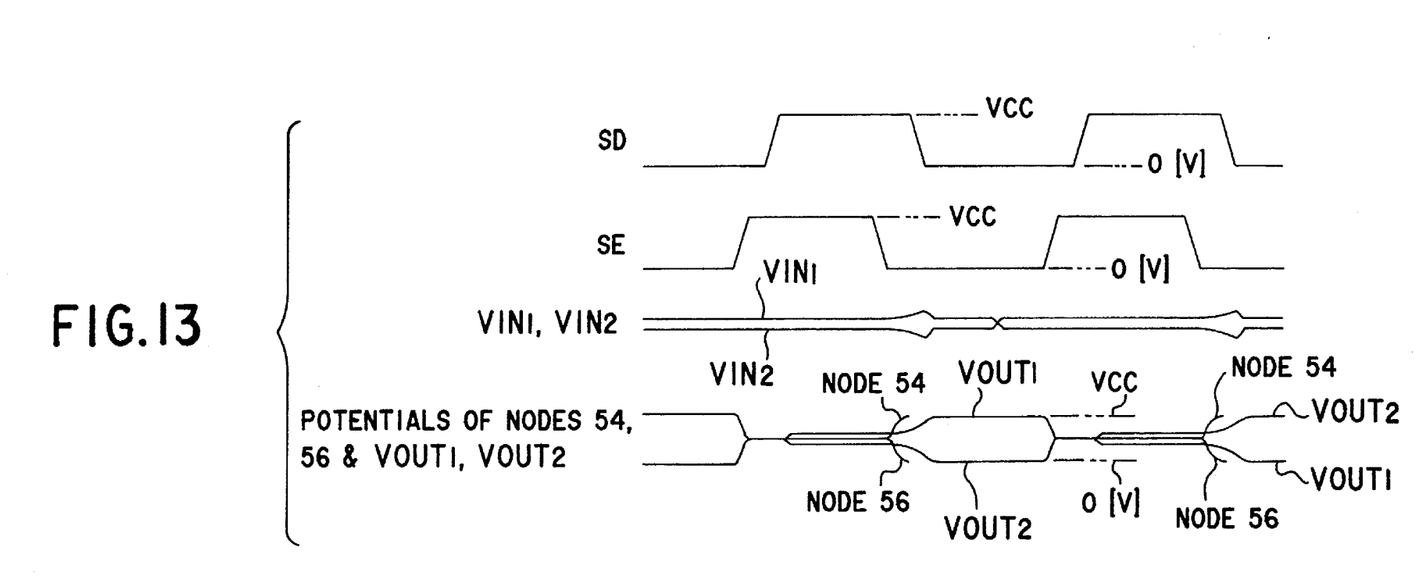
FIG. 13 is a diagram showing signal waveforms for explaining the operation of the fourth embodiment.

Next, a description will be given of a fourth embodiment of the flip-flop type amplifier circuit according to the present invention, by referring to FIGS. 12 and 13. FIG. 12 shows the fourth embodiment, and FIG. 13 shows signal waveforms for explaining the operation of the fourth embodiment. In FIG. 12, those parts which are the same as those corresponding parts in FIGS. 7 and 10 are designated by the same reference numerals, and a description thereof will be omitted.

In this fourth embodiment, the transfer gate circuit 40 is provided in place of the current mirror circuits 66 and 67 of the third embodiment, similarly to the first and second embodiments. Otherwise, the construction of the fourth embodiment is basically the same as that of the third embodiment.

FIG. 13 shows the signal waveforms at various parts of the flip-flop type amplifier circuit shown in FIG. 12. FIG. 13 shows the timings of the transfer control signal SD, the reset control signal SE, the voltages VIN1 and VIN2, the voltages VIN1 and VIN2, and the potentials at the nodes 54 and 56 together with the output voltages VOUT1 and VOUT2.

In this fourth embodiment, the analog switches 41 and 42 are turned OFF when the transfer control signal SD is 0 V, and the analog switch 58 is turned OFF when the reset control signal SE is 0 V. That is, the voltage VIN1 is applied to the node 38 and the voltage VIN2 is applied to the node 39 in the state where the flip-flop circuit 45 latches the previous data, so that the voltage difference between the voltages VIN1 and VIN2 is amplified. In this case, it is assumed that VIN1>VIN2.

Before the transfer control signal SD is set to the voltage Vcc, the reset control signal SE is set to the voltage Vcc, the analog switch 58 is turned ON, the nodes 54 and 56 are short-circuited via the analog switch 58, and the potentials of the nodes 54 and 56 are set to the same potential.

As a result, the potentials of the nodes 61 and 62, that is, the output voltages VOUT1 and VOUT2, are set to the same potential, and the resetting operation is completed. In this case, the potentials of the nodes 61 and 62, that is, the output voltages VOUT1 and VOUT2, are set to a voltage of approximately (½)·vcc.

Next, the transfer control signal SD is set to the voltage Vcc, the analog switches 41 and 42 are turned ON, the output voltage VOUT1 is set to the voltage VIN1, and the output voltage VOUT2 is set to the voltage VIN2.

Then, the reset control signal SE is set to 0 V, the analog switch 58 is turned OFF, and the short-circuited state between the nodes 54 and 56 is released. As a result, the potential of the node 54 rises towards the voltage Vcc, and the potential of the node 56 falls towards 0 V.

Because VIN1>VIN2 in this case, the pMOS transistor 48 is OFF, the nMOS transistor 50 is ON, the pMOS transistor 49 is ON, and the nMOS transistor 51 is OFF.

In addition, the pMOS transistor 74 is ON, the pMOS transistor 75 is OFF, the nMOS transistor 76 is OFF, and the nMOS transistor 77 is ON.

In other words, in this particular case, the pMOS transistor 75 out of the pMOS transistors 74 and 75 operates in the triode region, and the nMOS transistor 76 out of the nMOS transistors 76 and 77 operates in the triode region.

Accordingly, the potential of the node 61 rises towards the voltage Vcc and the potential of the node 62 falls towards 0 V, as described above. That is, the voltage VIN1 and the output voltage VOUT1 rise towards the voltage Vcc, and the voltage VIN2 and the output voltage VOUT2 fall towards 0 V.

Next, the transfer control signal SD is set to 0 V, and the analog switches 41 and 42 are turned OFF. Hence, the voltage VIN1 falls to the original voltage and the voltage VIN2 rises to the original voltage. Further, the potential of the node 62, that is, the output voltage VOUT1, becomes equal to the voltage Vcc, and the potential of the node 61, that is, the output voltage VOUT2, becomes equal to 0 V, and the amplifying operation is completed.

The output voltages VOUT1 and VOUT2 are latched during the time in which the reset control signal SE is 0 V.

According to this fourth embodiment, the pMOS transistors 74 and 75 are connected between the power line 52 and the node 54 of the flip-flop circuit 45 as the impedance elements. In addition, the nMOS transistors 76 and 77 are connected between the node 56 of the flip-flop circuit 45 and the ground as the impedance elements. Moreover, the nodes 54 and 56 are short-circuited via the analog switch 58, so that the resetting operation can be carried out by making the potentials of the nodes 61 and 62 the same.

In other words, it is possible to carry out the resetting operation without the need to connect an element which would operate as a constant current source circuit for a predetermined time between the power line 52 and the node 54 of the flip-flop circuit 45 and between the node 56 of the flip-flop circuit 45 and the ground.

As a result, when this fourth embodiment is used in the sense amplifier of the semiconductor memory device, for example, and the latch operation of the flip-flop circuit 45 is to be started after the resetting operation is completed, it is unnecessary to delay the start timing of the latch operation of the flip-flop circuit 45 by taking into consideration the time it takes for the voltage difference between the voltages VIN1 and VIN2 to become sufficiently large. In other words, the latch operation of the flip-flop circuit 45 can be started immediately after the resetting operation is completed. Therefore, it is possible to realize a high-speed circuit operation.

Furthermore, in this fourth embodiment, the voltage of approximately (½)·Vcc is applied to the gates of the pMOS transistors 74 and 75 and to the gates of the nMOS transistors 76 and 77 when carrying out the resetting operation. For this reason, the current which flows from the power line 52 to the ground via the pMOS transistors 74 and 75, the analog switch 58 and the nMOS transistors 76 and 77 in this fourth embodiment becomes smaller than the current which flows from the power line 52 to the ground via the pMOS transistor 53, the analog switch 58 and the nMOS transistor 55 in the first and second embodiments.

Accordingly, the fourth embodiment can reduce the power consumption when compared to the first and second embodiments.

Unlike the third embodiment, this fourth embodiment is provided with the transfer gate circuit 40 in place of the current mirror circuits 66 and 67. Hence, it is possible to make the high level of the output voltages VOUT1 and VOUT2 equal to the voltage Vcc and to make the low level of the output voltages VOUT1 and VOUT2 equal to 0 V. Therefore, this fourth embodiment can more effectively reduce the power supply voltage Vcc compared to the third embodiment.

Figure 14:
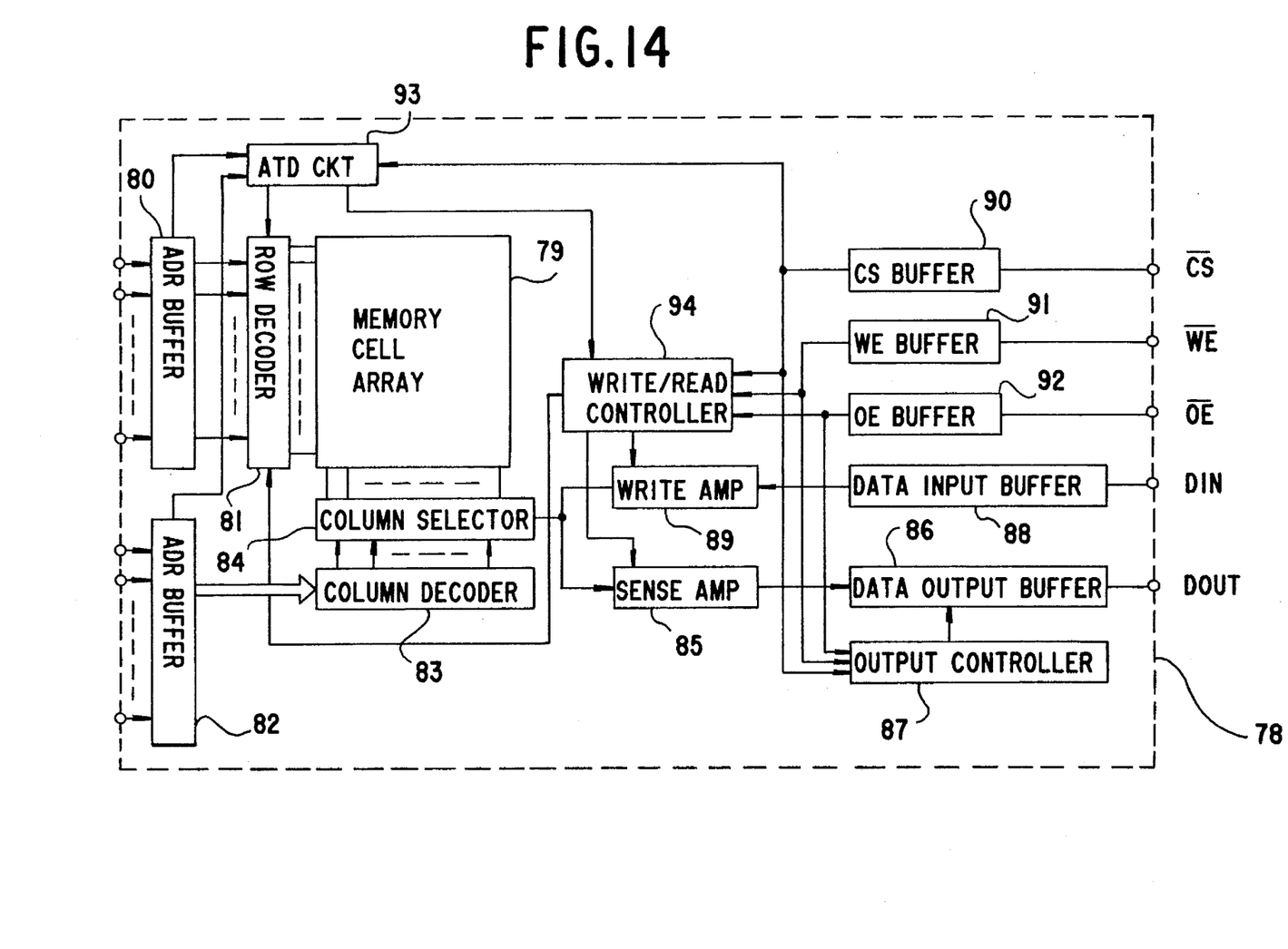
FIG. 14 is a system block diagram showing a semiconductor memory device having a sense amplifier which may be applied with the present invention.

Any one of the first through fourth embodiments of the flip-flop type amplifier circuit according to the present invention described above may be applied to the sense amplifier of the semiconductor memory device as shown in FIG. 14.

FIG. 14 shows a SRAM as an example of the semiconductor memory device. The SRAM shown in FIG. 14 includes a SRAM body 78, a memory cell array 79 including memory cells which are arranged in an array, an address buffer 80 which receives a row address signal, and a row decoder 81 which selects a word line by decoding the row address signal.

The SRAM also includes an addressbuffer 82 which receives a column address signal, a column decoder 83 which outputs a column selection signal by decoding the column address signal, and a column selector 84 which selects a column based on the column selection signal.

The SRAM further includes a sense amplifier 85 for amplifying the data read from the memory cell array 79, and the first through fourth embodiments of the flip-flop type amplifier circuit described above may be used as this sense amplifier 85. In this case, the nodes 38 and 39 are respectively connected to one and the other of the bit lines which form a pair.

Furthermore, the SRAM includes a data output buffer 86 which outputs an output data DOUT to the outside, an output controller 87 which controls the data output buffer 86, a data input buffer 88 which inputs an input data DIN, and a write amplifier 89 which is used during a write operation.

In addition, a CS buffer 90 receives a chip select signal/CS, a WE buffer 91 receives a write enable signal/WE, and an OE buffer 92 receives an output enable signal /OE, where "/" denotes a "bar" or an inverted signal.

An address transition detector (ATD) 93 detects a transition of the address signal and outputs an address transition detection signal ATD, and a write/read controller 94 controls the write/read operation of the SRAM.

Figure 15:
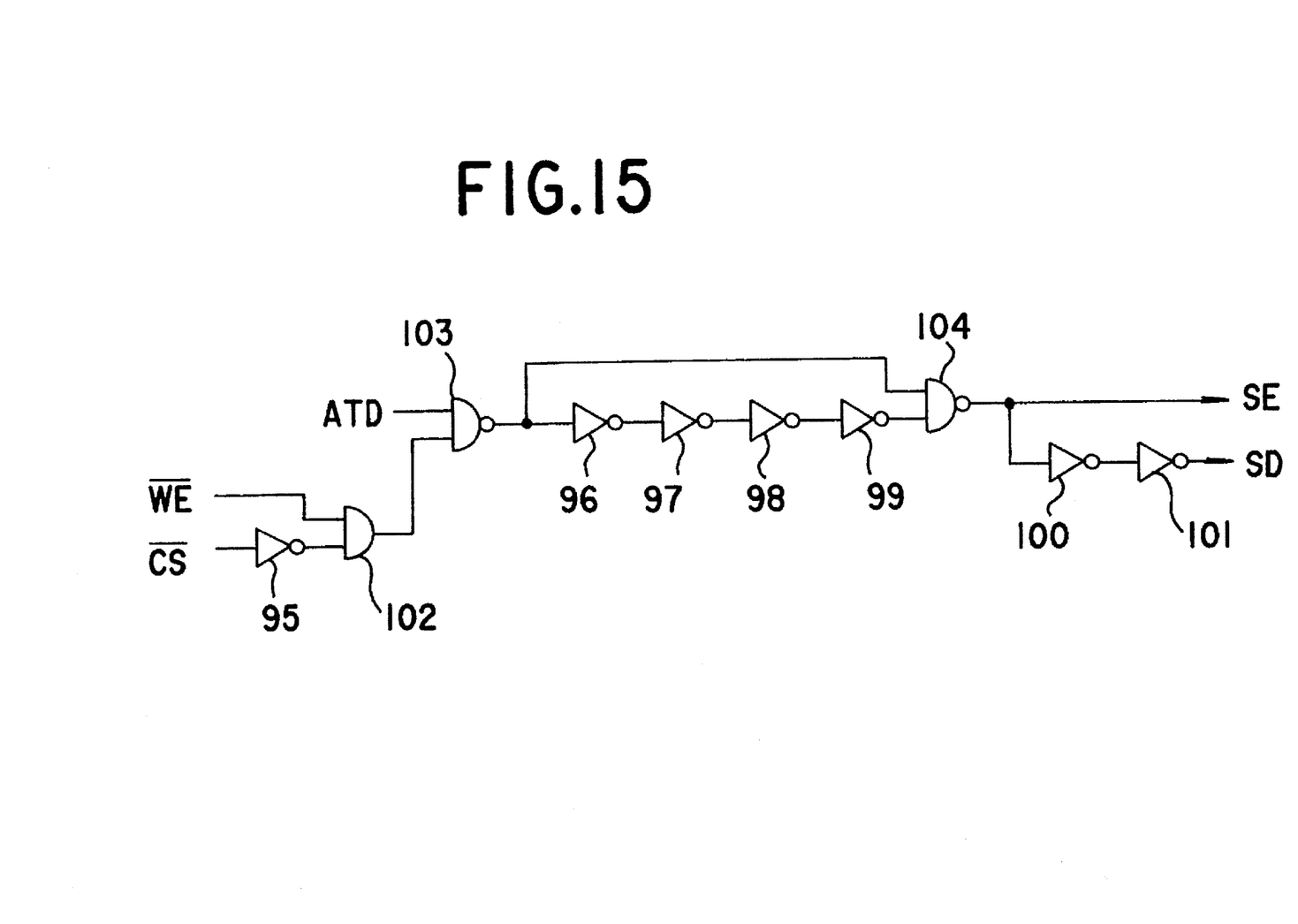
FIG. 15 is a circuit diagram showing a circuit for generating a transfer control signal and a reset control signal.

When using the first, second or fourth embodiment of the flip-flop type amplifier circuit according to the present invention for the sense amplifier 85 of the SRAM shown in FIG. 14, a circuit shown in FIG. 15 is provided within the write/read controller 94 to generate the transfer control signal SD and the reset control signal SE.

The circuit shown in FIG. 15 includes inverters 95 through 101, an AND circuit 102, and NAND circuits 103 and 104 which are connected as shown. The transfer control signal SD and the reset control signal SE are generated based on the address transition detection signal ATD, the write enable signal /WE and the chip select signal /CS.

Further, the present invention is not limited to these embodiments, but various variations and modifications may be made without departing from the scope of the present invention.

What is claimed is:

1. A flip-flop type amplifier circuit which amplifies a voltage difference between a first voltage and a second voltage, said flip-flop type amplifier circuit comprising:

a first power line supplying a first power supply voltage;

a second power line supplying a second power supply voltage lower than the first power supply voltage;

a flip-flop circuit including first through fourth nodes, and first and second inverters coupled in a ring and respectively made up of elements, said first node coupling an input of the first inverter and an output of the second inverter and receiving the first voltage, said second node coupling an output of the first inverter and an input of the second inverter and receiving the second voltage, wherein a current is being supplied through said third node to the elements of each of the first and second inverters coupled closest to said first power line, wherein a current is output through said fourth node from the elements of each of the first and second inverters coupled closest to said second power line;

a first impedance element coupled between said first power line and the third node of said flip-flop circuit;

a second impedance element coupled between said second power line and the fourth node of said flip-flop circuit; and switching means, coupled between the third and fourth nodes of said flip-flop circuit, for electrically connecting the third and fourth nodes in an ON state and for disconnecting the third and fourth nodes in an OFF state in response to a reset control signal, said switching means being turned ON when resetting the flip-flop type amplifier circuit and being turned OFF after the resetting, in response to the reset control signal.

2. A flip-flop type amplifier circuit which amplifies a voltage difference between a first voltage and a second voltage, said flip-flop type amplifier circuit comprising:

a first power line supplying a first power supply voltage;

a second power line supplying a second power supply voltage lower than the first power supply voltage;

a flip-flop circuit including first through fourth nodes, and first and second inverters coupled in a ring, said first node coupling an input of the first inverter and an output of the second inverter and receiving the first voltage, said second node coupling an output of the first inverter and an input of the second inverter and receiving the second voltage, said first inverter comprising
a first p-channel transistor forming a load element and having a source coupled to the third node, a drain coupled to the first node and a gate coupled to the second node; and
a first n-channel transistor forming a driving element and having a source coupled to the fourth node, a drain coupled to the first node and a gate coupled to the second node, and said second inverter comprises
a second p-channel transistor forming a load element and having a source coupled to the third node, a drain coupled to the second node and a gate coupled to the first node; and
a second n-channel transistor forming a driving element and having a source coupled to the fourth node, a drain coupled to the second node and a gate coupled to the first node, a first impedance element coupled between said first power line and the third node of said flip-flop circuit;

a second impedance element coupled between said second power line and the fourth node of said flip-flop circuit; and switching means coupled between the third and fourth nodes of said flip-flop circuit, for electrically connecting the third and fourth nodes in an ON state and for disconnecting the third and fourth nodes in an OFF state in response to a reset control signal, said switching means being turned ON when resetting the flip-flop type amplifier circuit and being turned OFF after the resetting, in response to the reset control signal.

3. The flip-flop type amplifier circuit as claimed in claim 2, wherein said first and second p-channel transistors are made up of p-channel insulated gate type field effect transistors, and said first and second n-channel transistors are made up of n-channel insulated gate type field effect transistors.

4. A flip-flop type amplifier circuit which amplifies a voltage difference between a first voltage and a second voltage, said flip-flop type amplifier circuit comprising a first power line supplying a first power supply voltage:

a second power line supplying a second power supply voltage lower than the first power supply voltage:

a flip-flop circuit including first through fourth nodes, and first and second inverters coupled in a ring, said first node coupling an input of the first inverter and an output of the second inverter and receiving the first voltage, said second node coupling an output of the first inverter and an input of the second inverter and receiving the second voltage;

a first impedance element coupled between said first power line and the third node of said flip-flop circuit;

a second impedance element coupled between said second power line and the fourth node of said flip-flop circuit;

switching means, coupled between the third and fourth nodes of said flip-flop circuit, for electrically connecting the third and fourth nodes in an ON state and for disconnecting the third and fourth nodes in an OFF state in response to a reset control signal;

a first analog switch through which the first voltage is supplied to the first node, said first analog switch being turned OFF before the resetting is started and being turned ON after the resetting is completed, in response to a transfer control signal; and a second analog switch through which the second voltage is supplied to the second node, said second analog switching being turned OFF before the resetting is started and being turned ON after the resetting is completed, in response to the transfer control signal.

5. The flip-flop type amplifier circuit as claimed in claim 4, wherein said first impedance element comprises a p-channel insulated gate type field effect transistor having a source coupled to said first power line, a gate, and a drain which is connected to the gate of the p-channel insulated gate type field effect transistor and is coupled to the third node; and said second impedance element comprises an n-channel insulated gate type field effect transistor having a source coupled to said second power line, a gate, and a drain which is connected to the gate of the n-channel insulated gate type field effect transistor and is coupled to the fourth node.

6. The flip-flop type amplifier circuit as claimed in claim 4, wherein said first impedance element comprises a p-channel insulated gate type field effect transistor having a source coupled to said first power line, a gate coupled to said second power line, and a drain coupled to the third node; and said second impedance element comprises an n-channel insulated gate type field effect transistor having a source coupled to said second power line, a gate coupled to said first power line, and a drain coupled to the fourth node.

7. The flip-flop type amplifier circuit as claimed in claim 4, wherein said first impedance element comprises first and second p-channel insulated gate type field effect transistors having sources coupled in common to said first power line and drains coupled in common to the third node; and said second impedance element comprises first and second n-channel insulated gate type field effect transistors having sources coupled in common to said second power line and drains coupled in common to the fourth node, said first p-channel insulated gate type field effect transistor and said first n-channel insulated gate type field effect transistor each having a gate coupled to the first node, said second p-channel insulated gate type field effect transistor and said second n-channel insulated gate type field effect transistor each having a gate coupled to the second node.

8. A flip-flop type amplifier circuit which amplifies a voltage difference between a first voltage and a second voltage, said flip-flop type amplifier circuit comprising;

a first power line supplying a first power supply voltage:

a second power line supplying a second power supply voltage lower than the first power supply voltage:

a flip-flop circuit including first through fourth nodes, and first and second inverters coupled in a ring, said first node coupling an input of the first inverter and an output of the second inverter and receiving the first voltage, said second node coupling an output of the first inverter and an input of the second inverter and receiving the second voltage;

a first impedance element coupled between said first power line and the third node of said flip-flop circuit:

a second impedance element coupled between said second power line and the fourth node of said flip-flop circuit;

switching means, coupled between the third and fourth nodes of said flip-flop circuit, for electrically connecting the third and fourth nodes in an ON state and for disconnecting the third and fourth nodes in an OFF state in response to a reset control signal;

a first current mirror circuit through which the first voltage is supplied to the first node; and a second current mirror circuit through which the second voltage is supplied to the second node.

9. The flip-flop type amplifier circuit as claimed in claim 8, wherein said first impedance element comprises a p-channel insulated gate type field effect transistor having a source coupled to said first power line, a gate, and a drain which is connected to the gate of the p-channel insulated gate type field effect transistor and is coupled to the third node; and said second impedance element comprises an n-channel insulated gate type field effect transistor having a source coupled to said second power line, a gate, and a drain which is connected to the gate of the n-channel insulated gate type field effect transistor and is coupled to the fourth node.

10. The flip-flop type amplifier circuit as claimed in claim 8, wherein said first impedance element comprises a p-channel insulated gate type field effect transistor having a source coupled to said first power line, a gate coupled to said second power line, and a drain coupled to the third node; and said second impedance element comprises an n-channel insulated gate type field effect transistor having a source coupled to said second power line, a gate coupled to said first power line, and a drain coupled to the fourth node.

11. The flip-flop type amplifier circuit as claimed in claim 8, wherein said first impedance element comprises first and second p-channel insulated gate type field effect transistors having sources coupled in common to said first power line and drains coupled in common to the third node; and said second impedance element comprises first and second n-channel insulated gate type field effect transistors having sources coupled in common to said second power line and drains coupled in common to the fourth node, said first p-channel insulated gate type field effect transistor and said first n-channel insulated gate type field effect transistor each having a gate coupled to the first node, said second p-channel insulated gate type field effect transistor and said second n-channel insulated gate type field effect transistor each having a gate coupled to the second node.

* * * * *